United States Patent
Harrabi

(10) Patent No.: US 12,356,871 B2
(45) Date of Patent: Jul. 8, 2025

(54) NANOWIRE HOTSPOT CONTROLLABLE AND TUNABLE COUPLING OF SUPERCONDUCTING QUBITS

(71) Applicant: KING FAHD UNIVERSITY OF PETROLEUM AND MINERALS, Dhahran (SA)

(72) Inventor: Khalil Harrabi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 437 days.

(21) Appl. No.: 18/155,889

(22) Filed: Jan. 18, 2023

(65) Prior Publication Data
US 2024/0244985 A1  Jul. 18, 2024

(51) Int. Cl.
*H10N 69/00* (2023.01)
(52) U.S. Cl.
CPC ................... *H10N 69/00* (2023.02)
(58) Field of Classification Search
CPC ................ H10N 69/00; H10N 60/12
See application file for complete search history.

(56) References Cited

U.S. PATENT DOCUMENTS

| | | | |
|---|---|---|---|
| 10,665,635 B1 | 5/2020 | Sandberg et al. | |
| 2019/0273196 A1 | 9/2019 | Marcus et al. | |
| 2019/0371926 A1 | 12/2019 | Hutin et al. | |
| 2020/0161531 A1* | 5/2020 | Olivadese | H10N 60/815 |
| 2020/0321508 A1* | 10/2020 | Hart | H10D 62/882 |
| 2020/0381608 A1 | 12/2020 | Olivadese et al. | |
| 2021/0020821 A1 | 1/2021 | Nayfeh et al. | |
| 2021/0399044 A1* | 12/2021 | Gumann | H10N 69/00 |
| 2022/0181535 A1* | 6/2022 | Holmes | H10N 60/128 |
| 2022/0189922 A1* | 6/2022 | Abraham | H10D 48/3835 |
| 2025/0055457 A1* | 2/2025 | Whittaker | H03K 5/1252 |

OTHER PUBLICATIONS

Sunghun Park, et al., "Andreev spin qubits in multichannel Rashba nanowires", Physical Review B, Condensed Matter > Mesoscale and Nanoscale Physics, arXiv:1707.04273v1 [cond-mat.mes-hall], vol. 96, Issue 12-15, Article No. 125416, Jul. 13, 2017, pp. 1-14.

* cited by examiner

*Primary Examiner* — Ali Naraghi
(74) *Attorney, Agent, or Firm* — Oblon, McClelland, Maier & Neustadt, L.L.P.

(57) ABSTRACT

A first superconducting device includes two first adjacent superconducting qubits and a superconducting loop disposed between and inductively coupled to the two first adjacent superconducting qubits. The superconducting loop includes a first hotspot nanowire that is in a superconducting state when a bias current is less than a critical current and in a high resistive state when the bias current is not less than the critical current. A second superconducting device includes two second adjacent superconducting qubits and a superconducting lead extending from one superconducting qubit to the other and being capacitively coupled to the two second adjacent superconducting qubits. The superconducting lead includes a second hotspot nanowire that is in a superconducting state when a bias current is less than a critical current and in a high resistive state when the bias current is not less than the critical current.

20 Claims, 10 Drawing Sheets

NANOWIRE HOTSPOT CONTROLLABLE AND TUNABLE COUPLING OF SUPERCONDUCTING QUBITS

BACKGROUND

Technical Field

The present disclosure relates to superconducting quantum bit circuits and quantum computing.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In quantum computing, quantum mechanical phenomena can be used to process data. The quantum mechanical phenomena, such as superposition (where quantum variables may exist in multiple different states at the same time) or entanglement (where multiple quantum variables have related states independent of their distance in space or time), does not have a similar situation in the world of classical computing. Conventional computers are based on classical mechanics, and their memories are made up of bits, where each bit represents either a logic one or logic zero value.

Like a classical computer, a quantum computer also has bits and gates. Instead of using logical ones and logical zeroes, a quantum bit ("qubit") uses quantum mechanics to occupy both possibilities simultaneously. Similar to bits in the classical computer, the qubit can be either a 0 or a 1 at any given time. However, in contrast to the bits of the classical computer, qubit elements can be both 0 and 1, resulting in a superposition of quantum states. This ability means that the quantum computer can solve certain problems more efficiently than the classical computer, since the quantum computer can run exponentially faster than the classical computer.

Quantum information processing operates by manipulating quantum states using a quantum algorithm. Therefore, to perform a certain algorithm, a long coherence time is required. For the implementation of real quantum algorithms, several hurdles need to be overcome, such as increasing the number of qubits and their coherence times. In some related quantum computers, superconducting qubits based on Josephson junction are considered for building quantum information processing. In addition, different types of qubits are also available, such as charge qubits, phase qubits, quantronium, flux qubits, and transmon. For the realization of the quantum information processing based on solid-state physics qubits, a few issues have to be addressed, such as the DiVincenzo criteria, many qubits, qubit-initialization, universal gate operations, readout, and long coherence time.

In addition, a coupling between two neighboring qubits must be controllable to achieve an effective coherence time. Different types of tunable coupling qubits schemes were proposed, fabricated, and measured. Some of the tunable coupling qubits are based on the use of the non-linearity of Josephson junctions and superconducting quantum interference device (SQUID) (the SQUID is formed by connecting two Josephson junctions in parallel). For example, a tunable inductive coupling of superconducting qubits in strongly nonlinear regime tunable interactions can be achieved through a mutual inductive coupling to a coupler circuit containing a nonlinear Josephson element.

In a related example, a coupling between a first qubit to a second qubit is achieved using a first coupling capacitance and a second coupling capacitance. A controllable inductance connecting a first conductive path is connected between the first coupling capacitance and the second coupling capacitance. The controllable inductance acts as a divider for signals going from the first qubit to the second qubit. The controllable inductance may be provided by a DC SQUID threaded by an amount of flux. Adjusting the controllable inductance may include varying the amount of flux threading the DC SQUID. However, the related method fails to provide an effective quantum coherence stability required for full qubit operation and fails to protect the qubits from decoherence so that the qubits can be in their information-holding state long enough to perform the necessary calculations and read the results.

Hence, there is a need for a superconducting device which can control the coupling strength between qubits and also provides a tuning of the coupling between the qubit and the quantum bus.

SUMMARY

Aspects of the disclosure provide a first superconducting device. The first superconducting device includes two adjacent superconducting qubits disposed on a surface of a first substrate and a superconducting loop disposed between the two adjacent superconducting qubits and being inductively coupled to the two adjacent superconducting qubits. The superconducting loop includes a hotspot nanowire that is biased by a bias current. The hotspot nanowire is in a superconducting state when the bias current is less than a critical current and in a high resistive state when the bias current is not less than the critical current.

In an embodiment, each superconducting qubit is associated with a respective resonator to couple a readout superconducting quantum bus.

In an embodiment, each resonator includes a hotspot nanowire.

In an embodiment, the hotspot nanowire is embedded in an etched hole of the first substrate.

In an embodiment, both sides of the hotspot nanowire include gold layers.

In an embodiment, the first superconducting device includes a superconducting current line underneath the hotspot nanowire with an isolating layer. The superconducting current line is biased by a direct current to generate a magnetic field.

In an embodiment, the isolating layer includes silicon oxide.

In an embodiment, the direct current is less than the critical current.

In an embodiment, the hotspot nanowire is disposed on a second substrate.

In an embodiment, the first substrate and the second substrate are bonded through bonding wires.

Aspects of the disclosure provide a second superconducting device. The second superconducting device includes two adjacent superconducting qubits disposed on a surface of a first substrate and a superconducting lead extending from one superconducting qubit to the other and being capacitively coupled to the two adjacent superconducting qubits. The superconducting lead includes a hotspot nanowire that is biased by a bias current. The hotspot nanowire is in a superconducting state when the bias current is less than a critical current and in a high resistive state when the bias current is not less than the critical current.

In an embodiment, each superconducting qubit is associated with a respective resonator to couple a readout superconducting quantum bus.

In an embodiment, each resonator includes a hotspot nanowire.

In an embodiment, the hotspot nanowire is embedded in an etched hole of the first substrate.

In an embodiment, both sides of the hotspot nanowire include gold layers.

In an embodiment, the second superconducting device includes a superconducting current line underneath the hotspot nanowire with an isolating layer. The superconducting current line is biased by a direct current to generate a magnetic field.

In an embodiment, the isolating layer includes silicon oxide.

In an embodiment, the direct current is less than the critical current.

In an embodiment, the hotspot nanowire is disposed on a second substrate.

In an embodiment, the first substrate and the second substrate are bonded through bonding wires.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
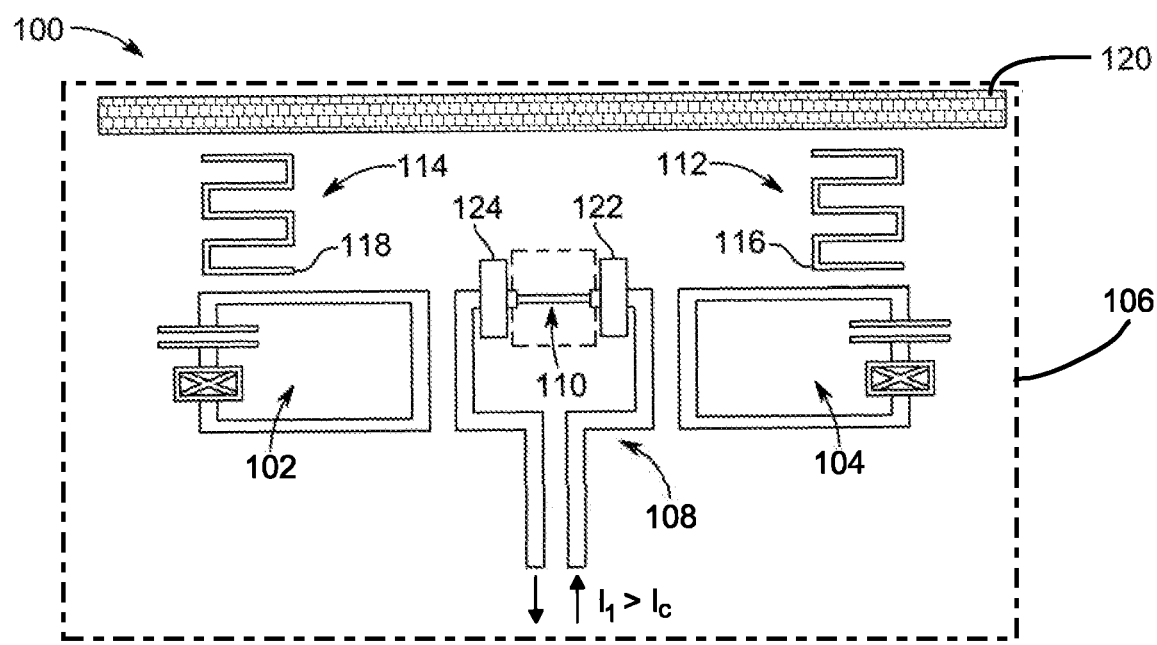
FIG. 1 illustrates a block diagram of a superconducting device including two adjacent superconducting qubits coupled through a superconducting loop including a hotspot nanowire, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Quantum computers are machines that rely on the use of quantum algorithms involving a single-qubit operation and a coupling of qubits by preserving quantum coherence. A quantum computer has advantage that it can run exponentially faster than a classical computer. However, the realization of the quantum computer faces many challenges that have to be overcome technologically. First, the difficulty is the construction of large-scale interacting qubits using a switchable coupling between adjacent qubits. These adjacent qubits are not isolated from their environment and remain coupled to the environment. That is a natural source of noise, generally leading to a reduction of a coherence time.

Aspects of this disclosure are directed to a superconducting device (having a hotspot nanowire) for controlling the coupling of two adjacent qubits. The quantum computing requires multiple (e.g., N) qubits, which should be coupled depending on the design and architecture used. The disclosure provides a coupling strength between the two qubits that can be efficiently and independently tuned on and off. The disclosed superconducting device can be used for tuning the coupling between each qubit and a readout coupling resonator of the N qubits (also referred to as quantum bus) without affecting a quality factor of the resonator.

In various aspects of the disclosure, non-limiting definitions of one or more terms that will be used in the disclosure are provided below.

The term "qubit" in quantum computing may refer to a building block of a quantum computer in the same way that a conventional binary bit is a building block of a classical computer. The qubit is a basic unit of information in the quantum computer. The qubit has two or more discrete energy states. The energy states of the qubit are referred to as the basis states of the qubit.

The term "coupler" in quantum computing may refer to a unit that is configured to exchange information between objects (qubits) by turning on a coupling between them or to isolate the objects by turning off that coupling. A tunable coupler controls a degree of the coupling strength between two qubits, i.e., between pure "on" (coupled) and pure "off" (uncoupled) states, by the provision of one or more variable control signals.

FIG. 1 illustrates a block diagram of a superconducting device 100, according to certain embodiments. Referring to FIG. 1, the superconducting device 100 includes two adjacent superconducting qubits 102, 104, and a superconducting loop 108. In an operative aspect, the superconducting loop 108 is configured to couple with each of the superconducting qubits 102, 104, individually. The superconducting qubits 102, 104 are inductively coupled to each other through the superconducting loop 108. In an aspect, the superconducting device 100 can be controlled independently using a current pulse.

The superconducting qubits 102, 104 are disposed on a surface of a first substrate 106. In an embodiment, the first substrate 106 may be a standard processing wafer, such as a wafer based on Silicon (Si)/Silicon dioxide ($SiO_2$), Si/Boron nitride (BN), Indium Arsenide (InAs)/$SiO_2$, InAs/BN or Gallium arsenide (GaAs). Each superconducting qubit 102, 104 is associated with a respective resonator 112, 114. In an aspect, each resonator 112, 114 is employed as a medium to transfer quantum information to and from the respective superconducting qubit coupled to the resonator. Each superconducting qubit 102, 104 is coupled to a readout superconducting quantum bus 120 through the respective associated resonator 112, 114. In an example, the readout superconducting quantum bus 120 is an electronic medium which is used to store or transfer information between independent superconducting qubits in a quantum computer, or combine two superconducting qubits into a superposition qubit. In an aspect, the superconducting qubits 102, 104 are designed differently to match with the resonant frequencies. For example, the superconducting qubits 102, 104 are Josephson junction-based devices. As shows in FIG. 1, "X" in the superconducting qubit represents the Josephson junction. In a structural aspect, each superconducting qubit 102, 104 includes a thin layer of an insulator, sandwiched between two superconducting layers. The insulating layer is so thin that Cooper pairs can tunnel through it and couple the superconducting wavefunctions on either side of a barrier.

The superconducting loop 108 (also termed as "coupler 108") is disposed between the two adjacent superconducting qubits 102, 104. The superconducting loop 108 is inductively coupled to the superconducting qubits 102, 104. The superconducting loop 108 has a hotspot nanowire 110. In an aspect, the hotspot nanowire 110 is embedded in an etched hole of the first substrate 106. In an aspect, the etched hole is fabricated prior to the fabrication of any element of a quantum circuit including the superconducting qubits, resonators, and the bias lines.

In an example, the hotspot nanowire 110 is made out of a superconducting material having a high resistivity when the hotspot nanowire 110 is switched into a normal state. In an aspect, the hotspot nanowire 110 may be made out of various superconducting materials such as Niobium-Titanium-Nitride (NbTiN), Niobium Nitride (NbN), and the like. For example, the hotspot nanowire 110 is an NbN hotspot nanowire 110. The hotspot nanowire 110 is configured to be biased by a bias current. The hotspot nanowire 110 is configured to be in a superconducting state when the bias current is less than a critical current ($I_c$). When the bias current is not less than the critical current ($I_c$), then the hotspot nanowire 110 is configured to be in a high resistive state. In an embodiment, the superconducting qubits 102, 104 are fabricated on the first substrate 106 and the hotspot nanowire 110 can be disposed on a second substrate. In an aspect, the first substrate 106 and the second substrate can be bonded together, for example through bonding wires.

According to aspects of the disclosure, a change in a resistance of the hotspot nanowire 110 can vary within a large range, for example between 100 kΩ and 10 MΩ. The resistance change at a phase slip center in the hotspot nanowire 110 is also observed. For example, the observed resistance change is about 280 kΩ. Due to the large range of the resistance change of the hotspot nanowire 110, heat is generated inside the etched area (as having the hotspot nanowire 110). Due to the generated heat, the propagating acoustic sound waves on the surface of the superconducting device 100 are decoupled from the superconducting qubits 102, 104. Due to the heat generation, quasi-particles are generated in the etched area that can be diffused along the superconducting loop 108. The quasi-particles are galvanically disconnected from the superconducting qubits 102, 104. To suppress the quasi-particle diffusion into the superconducting loop 108, a gold cold trap is incorporated on both sides of the hotspot nanowire 110. In an aspect, the hotspot nanowire 110 includes gold layers 122, 124 on both sides. In an aspect, a thickness of each gold layer 122, 124 is selected from a range of 200-300 nm. For example, each of the gold layers 122, 124 has a width in a range of 1-10 μm. In an aspect, each gold layer 122, 124 has a length in a range of 20-50 μm.

Figure 2A:
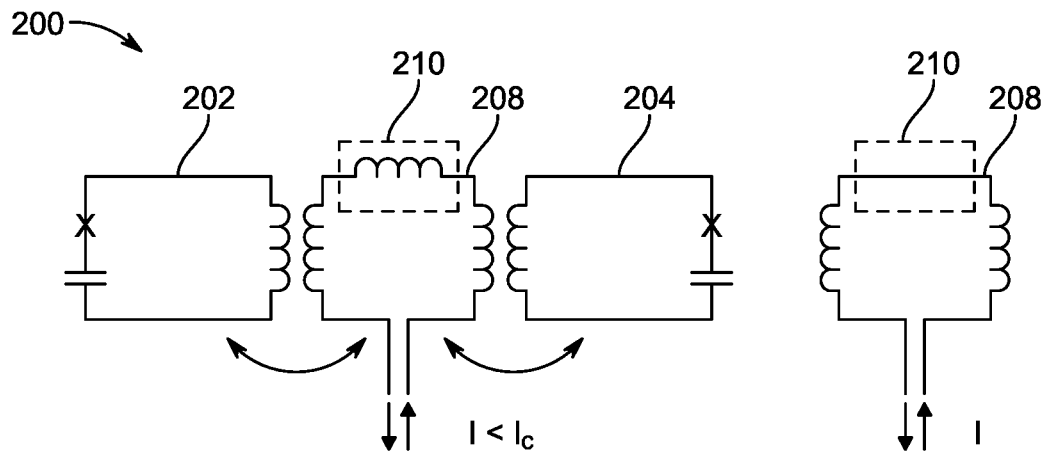
FIG. 2A illustrates an "On" state inductive coupling of the two coupled superconducting qubits, according to certain embodiments.
Figure 2B:
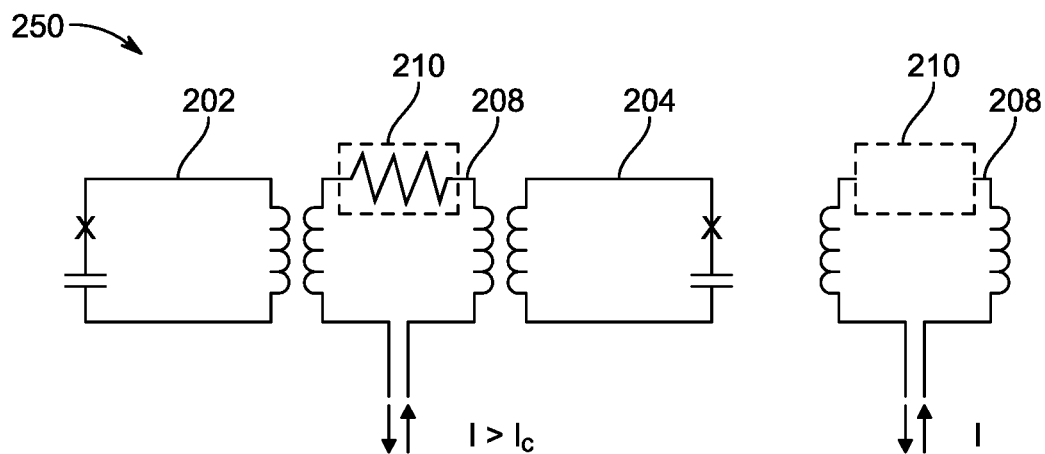
FIG. 2B illustrates an "Off" state inductive coupling of the two coupled superconducting qubits, according to certain embodiments.

With referring to FIG. 2A and FIG. 2B, the superconducting loop 208 is disposed between the two adjacent superconducting qubits 202, 204. The superconducting loop 208 is inductively coupled to the superconducting qubits 202, 204. In an aspect, the superconducting loop 208 is configured to operate at one of two states of the inductive coupling: "On" state inductive coupling or "Off" state inductive coupling.

FIG. 2A illustrates the "On" state inductive coupling 200 of the two coupled superconducting qubits 202, 204. The superconducting loop 208 is a superconducting loop wire, which is configured to inductively couple the two superconducting qubits 202, 204. During the "On" state inductive coupling 200, the hotspot nanowire 210 is considered as an inductor with a zero resistance. A direct coupling between the two superconducting qubits 202, 204 is negligible since the superconducting qubits 202, 204 are far away from each other. In an aspect, the bias current is applied to the hotspot nanowire 210. For example, the applied bias current has a variable current pulse amplitude. During the "On" state inductive coupling 200, the applied bias current is set below the critical value $I_c$ and the superconducting qubits 202, 204 are entangled. The hotspot nanowire 210 remains in a superconducting state under an electrical current excitation for a value not exceeding the critical current value $I_c$.

FIG. 2B illustrates an "Off" state inductive coupling 250 of the two coupled superconducting qubits 202, 204. When the applied bias current is larger than the critical value $I_c$ (cooper pair breaking current), the superconductivity of the hotspot nanowire 210 inside the etched hole is brought to a non-equilibrium state. The superconductivity is locally destroyed, and a normal hot spot (in a high resistive state) appears. The high resistive state breaks the coupling between the two superconducting qubits 202, 204, and switches off the coupling between the superconducting qubits 202, 204 in a relatively fast time. A resistance of the nanowire 210 can reach a few MΩ such as 10 MΩ. The hotspot nanowire 210 can be considered as an opened circuit, and as a consequence of the opened circuit, the two superconducting qubits 202, 204 are decoupled from each other. To bring back coupling to the "On" state, the applied bias current has to be reduced below the critical current value $I_c$.

Figure 3A:
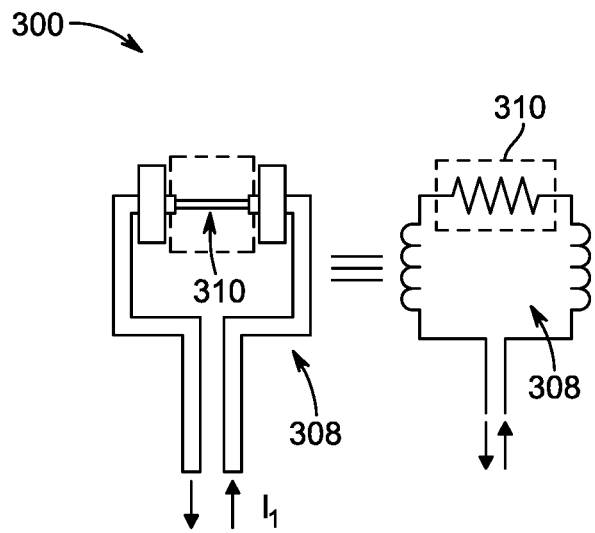
FIG. 3A illustrates an exemplary configuration of coupling the hotspot nanowire along with the superconducting loop, according to certain embodiments.
Figure 3B:
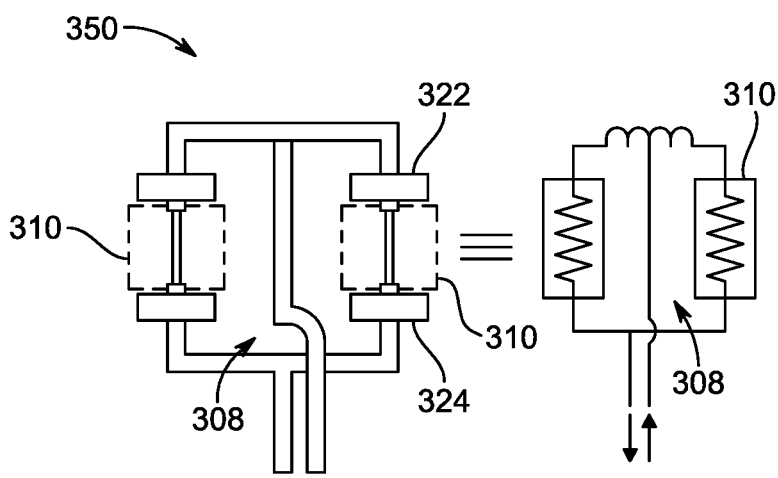
FIG. 3B illustrates another exemplary configuration of coupling the hotspot nanowire along with the superconducting loop, according to certain embodiments.

FIG. 3A-FIG. 3B illustrate different designs (300, 350) of the superconducting loop 308 having different placing locations of the hotspot nanowire 310 along with the superconducting loop 308, respectively. In an aspect, the hotspot nanowire 310 includes gold layers 322, 324 on both sides.

FIG. 3A illustrates an exemplary configuration 300 of coupling the hotspot nanowire 310 along with the superconducting loop 308 in which the hotspot nanowire 310 is serially placed in the superconducting loop 308. FIG. 3A also illustrates an electrical circuit corresponding to the exemplary configuration 300 when the hotspot nanowire 310 is in the "Off" state inductive coupling, wherein the hotspot nanowire 310 can be considered as a resistor with a high resistance.

FIG. 3B illustrates another exemplary configuration 350 of coupling two hotspot nanowires 310 along with the superconducting loop 308 in which the two hotspot nanowire 310 are placed at two places, parallel to each other, in the superconducting loop 308. FIG. 3B also illustrates an electrical circuit corresponding to the exemplary configuration 350 when the two hotspot nanowires 310 are in the "Off" state inductive coupling, wherein each hotspot nanowire 310 can be considered as a resistor with a high resistance.

Figure 4:
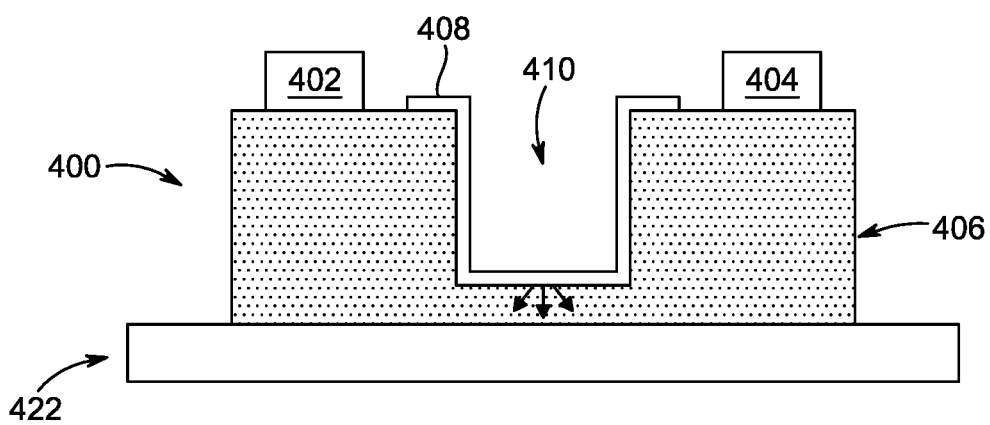
FIG. 4 illustrates a cross-sectional view of the superconducting device in which the hotspot nanowire is fabricated in an etched area of a substrate of the superconducting device, according to certain embodiments.

FIG. 4 illustrates a cross-sectional view 400 of two coupled superconducting qubits 402, 404 and a superconducting loop 408 including a hotspot nanowire 410 placed in an etched area of a substrate 406. A resistance of the superconducting loop 408 during the "On" state inductive coupling can exceed 10 MΩ for example. In an aspect, the high resistance can cause a quantum phase slip in the hotspot nanowire 410, inducing a finite resistance and therefore leading to a destruction of persistent currents. A critical current of the hotspot nanowire 410 is in order of a few micro-ampere, with a relative resistance of a few MΩ such as 10 MΩ, therefore a dissipative power of the hotspot nanowire 410 is in order of a few microwatt. In an aspect, the dissipative power can be easily thermally anchored to a sample holder 422.

Figure 5A:
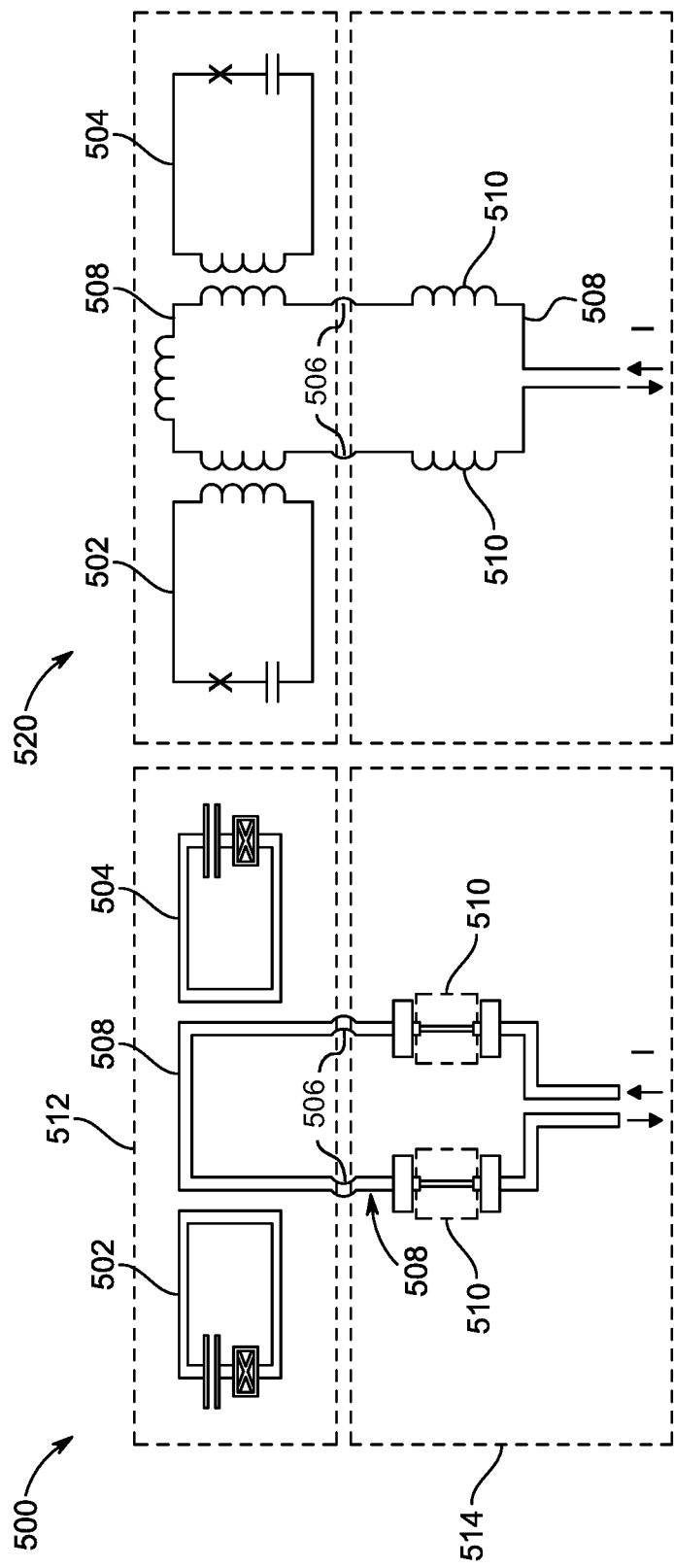
FIG. 5A illustrates an exemplary coupling configuration in which the two coupled superconducting qubits and the hotspot nanowires in the superconducting loop are fabricated on different chips, according to certain embodiments.
Figure 5B:
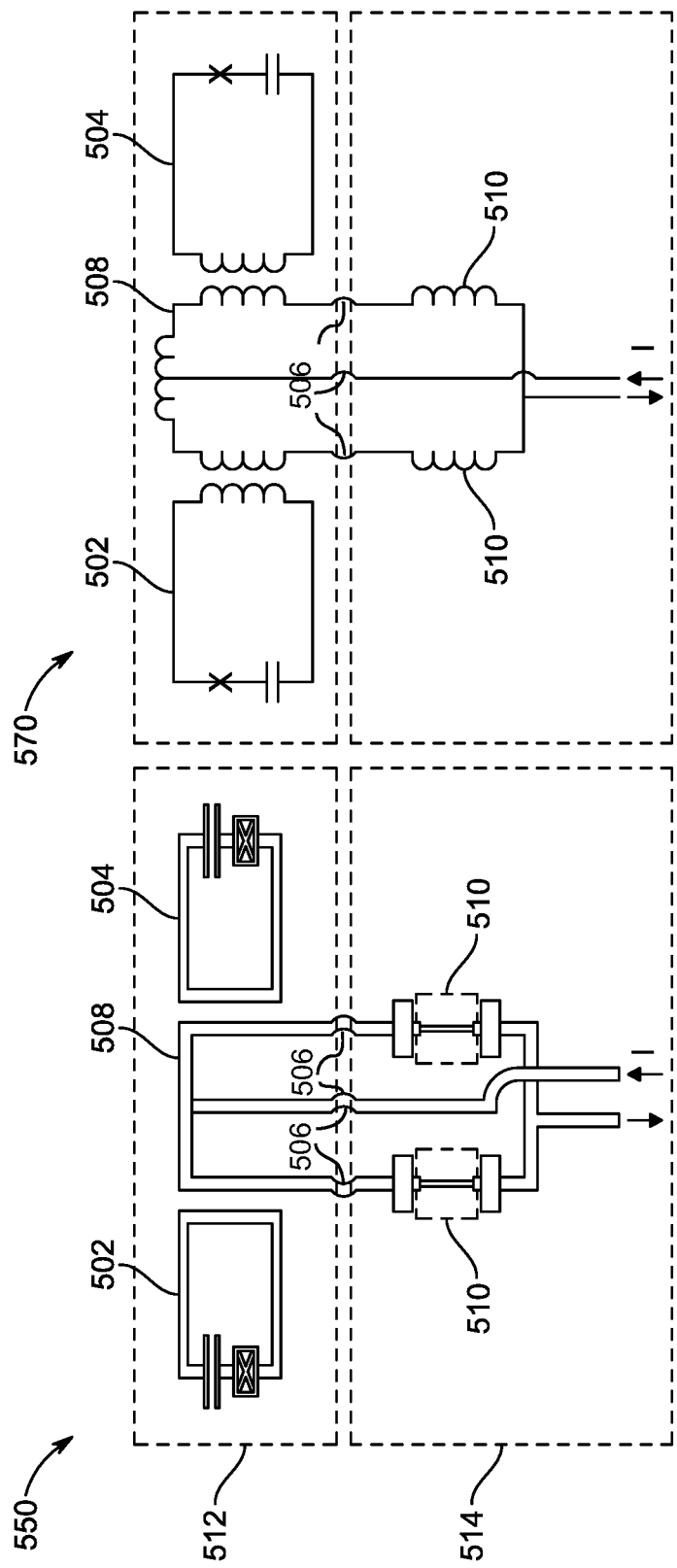
FIG. 5B illustrates another exemplary coupling configuration in which the two coupled superconducting qubits and the hotspot nanowires in the superconducting loop are fabricated on different chips, according to certain embodiments.

In another aspect, the dissipative power can be eliminated by fabricating different parts of the superconducting loop on different chips by adopting coupling configurations 500 and 550 as shown in FIG. 5A and FIG. 5B, respectively. FIG. 5A illustrates an exemplary coupling configuration 500 in which two coupled superconducting qubits 502, 504 and the superconducting loop 508 including two hotspot nanowires 510 are fabricated on different chips 512 and 514, according to certain embodiments. Also, FIG. 5A illustrates an electrical circuit 520 corresponding to the coupling configuration 500 when the two hotspot nanowires 510 are in the "On" state inductive coupling, wherein each hotspot nanowire 510 can be considered as an inductor with a zero resistance. One part of the superconducting 508 is fabricated on the chip 512 and the other part of the superconducting 508 including the two hotspot nanowires 510 is fabricated on the chip 514. Both parts of the superconducting loop 508 can be connected by using bonding wires 506 between the chips 512 and 514, so the thermal dissipation of the two hotspot nanowires 510 can occur on the chip 514 as shown in FIG. 5A. Based on the bias current, the superconducting loop 508 is configured to be switched on and off. As shown in FIG. 5A, the coupled superconducting qubits 502, 504 are fabricated on the chip 512, whereas the two hotspot nanowires 510 are placed in serial to each other on the chip 514.

Both parts of the superconducting loop 508 can be connected by using bonding wires 506 between the chips 512 and 514, so the thermal dissipation of the two hotspot nanowires 510 can occur on the chip 514 as shown in FIG. 5B. Based on the bias current, the superconducting loop 508 is configured to be switched on and off. As shown in FIG. 5B, the coupled superconducting qubits 502, 504 are fabricated on the chip 512. The two hotspot nanowires 510 are placed in parallel to each other on the chip 514.

Figure 6:
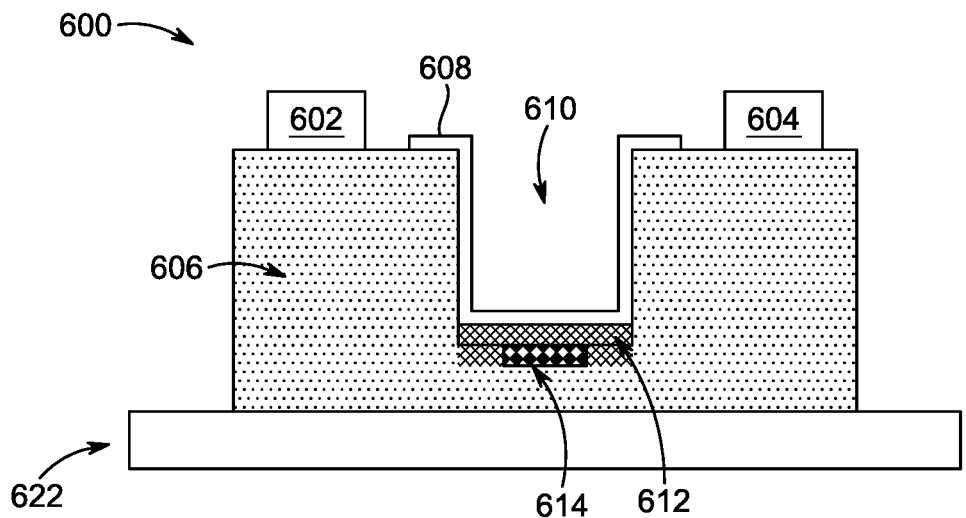
FIG. 6 illustrates a cross-sectional view of a chip having two coupled superconducting qubits and a superconducting current line fabricated underneath a hotspot nanowire, according to certain embodiments.

FIG. 6 illustrates a cross-sectional view of a chip 600 having two coupled superconducting qubits 602, 604 and a superconducting loop 608 including a hotspot nanowire 610 fabricated in an etched area of a substrate 606. As it is evident that, during the "On" state inductive coupling, a resistance of the superconducting loop 608 can exceed to a few MΩ (e.g., 10 MΩ), therefore causing a power dissipation. In an aspect, the power dissipation can be reduced by fabricating a dc bias superconducting current line (magnetic bias line) 614 underneath the hotspot nanowire 610. The superconducting current line 614 is biased by a direct current to generate a magnetic field. The superconducting current line 614 is separated from the hotspot nanowire 610 using an isolating layer 612. For example, the isolating layer 612 is fabricated by SiOx. In an aspect, the isolating layer 612 has a thickness in a range of 3 nm to 50 nm. For example, the superconducting current line 614 has a thickness in a range of 100 to 200 nm and has a width in a range of 1-10 μm.

By supplying the dc current into the superconducting current line 614, due to Biot-Savart law, a magnetic field $B=\mu_0 i/2\pi r$, where B is magnetic field intensity, $\mu_0$ is permeability of free space, i is current intensity, and r is radius. The magnetic field is generated in the vicinity of the superconducting current line 614. The generated magnetic field reduces the critical current of the hotspot nanowire 610. For example, for the isolating layer 612 having a thickness of 10 nm, the superconducting current line 614 generates a magnetic field of 200 Gauss for a direct current of 1 mA. In an example, the superconducting current line 614 is 10 μm wide and 100 nm thick. The direct current remains below the critical current of the superconducting current line 614 such that the superconducting current line 614 is in the superconducting state and generates the magnetic field that reduces the critical current for the hotspot nanowire 610. The sample holder 622 is placed below the substrate 606 for dissipating thermal power released during an operation of the superconducting device 600.

Figure 7A:
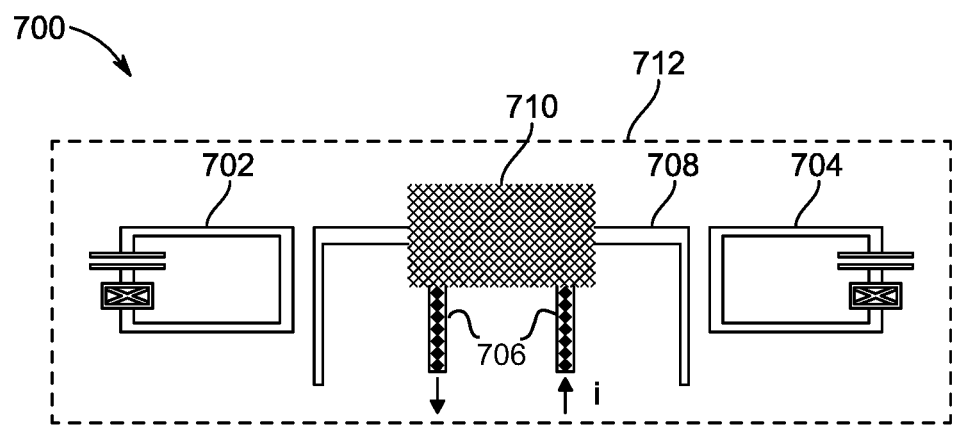
FIG. 7A illustrates a top view of a coupling configuration in which two superconducting qubits and a superconducting loop are fabricated on a same chip having different layers, according to certain embodiments.

FIG. 7A illustrates a top view of a coupling configuration 700 in which two superconducting qubits 702, 704 and a hotspot nanowire in a superconducting loop 708 are fabricated on a same chip 712 having different layers. The superconducting qubits 702, 704 and a part of the superconducting loop 708 are fabricated on a first layer of the chip 712. The hotspot nanowire of the superconducting loop 708 is fabricated on a second layer and in an etched area 710 of the chip 712. A superconducting current line 706 is fabricated underneath the etched area 710 and in a third layer of the chip 712.

Figure 7B:
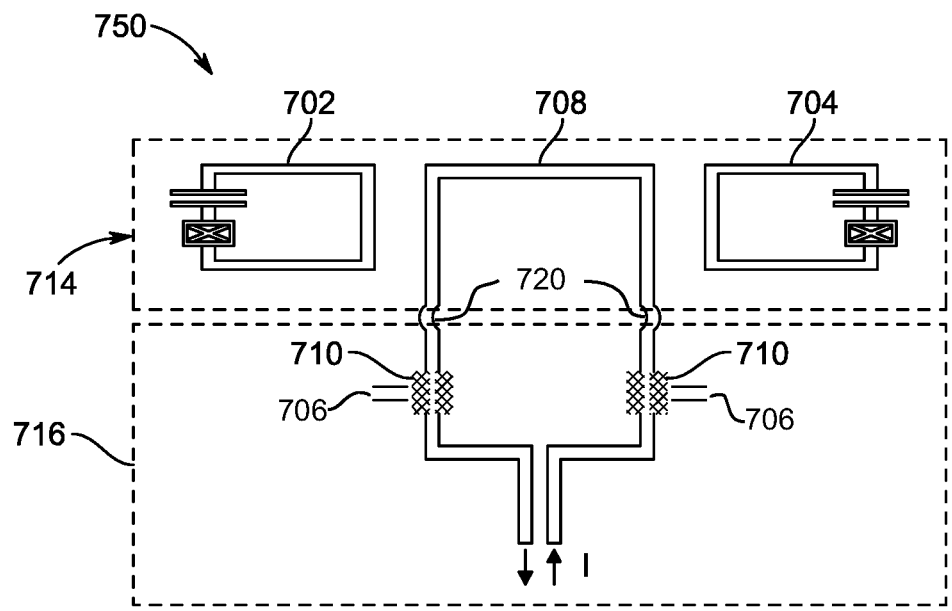
FIG. 7B illustrates a top view of another coupling configuration in which two superconducting qubits and two hotspot nanowires in a superconducting loop are fabricated on different chips, according to certain embodiments.

FIG. 7B illustrates a top view of another coupling configuration 750 in which the superconducting qubits 702, 704 and two hotspot nanowires 710 in the superconducting loop 708 are fabricated on the different chips 714 and 716. As shown in FIG. 7B, the coupled superconducting qubits 702, 704 are placed on the chip 714, whereas the two hotspot nanowires 710 are fabricated on the chip 716. Superconducting current lines 706 are placed underneath the hotspot nanowires 710. Different parts of the superconducting loop 708 are coupled through bonding wires 720 between the chips 714 and 716.

According to aspects of the disclosure, two adjacent superconducting qubits can be capacitively coupled through a hotspot nanowire. The same principle of the inductive coupling and decoupling of the superconducting qubits by monitoring a current in the hotspot nanowire above or below a critical current value can be adopted for the capacitive coupling between the two adjacent superconducting qubits.

Figure 8A:
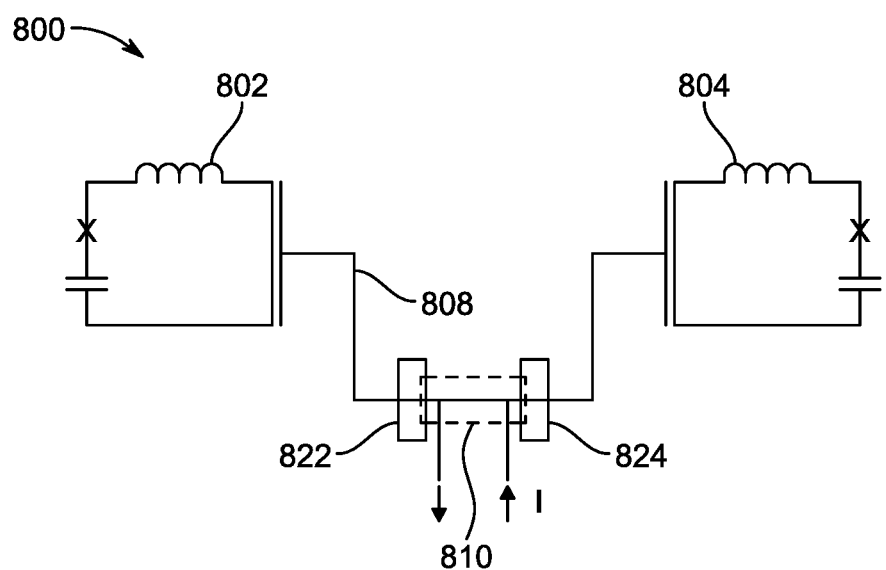
FIG. 8A illustrates an exemplary schematic diagram of a superconducting device, according to certain embodiments.

FIG. 8A illustrates an exemplary schematic diagram of a superconducting device 800, according to certain embodiments. Referring to FIG. 8, the superconducting device 800 includes two adjacent superconducting qubits 802, 804 and a superconducting lead 808. The superconducting lead 808 is capacitively coupled to the two adjacent superconducting qubits 802, 804. In an aspect, the superconducting device 800 can be controlled independently using a current pulse.

The superconducting qubits 802, 804 are disposed on a surface of a substrate. Each superconducting qubits 802, 804 is coupled to a readout superconducting quantum bus through two different resonators. In an aspect, the superconducting qubits 802, 804 are designed differently to match with the resonant frequencies. For example, the superconducting qubits 802, 804 are Josephson junction based devices. As shown in FIG. 8A, "X" in the superconducting qubit represents the Josephson junction. In a structural aspect, each superconducting qubit includes a thin layer of an insulator, sandwiched between two superconducting layers. The insulating layer is so thin that the Cooper pairs can tunnel through it and couple the superconducting wavefunctions on either side of a barrier.

The superconducting lead 808 extends from one superconducting qubit 802 to the other superconducting qubit 804. The superconducting lead 808 includes a hotspot nanowire 810. In an aspect, the hotspot nanowire 810 is embedded in an etched hole of the substrate.

In an operative aspect, the hotspot nanowire 810 is configured to be biased by a bias current. When the bias current is less than a critical current, the hotspot nanowire 810 operates in a superconducting state. When the bias current is not less than the critical current, the hotspot nanowire operates in a high resistive state. In an aspect, the hotspot nanowire 810 includes gold layers 822, 824 on both sides.

Figure 8B:
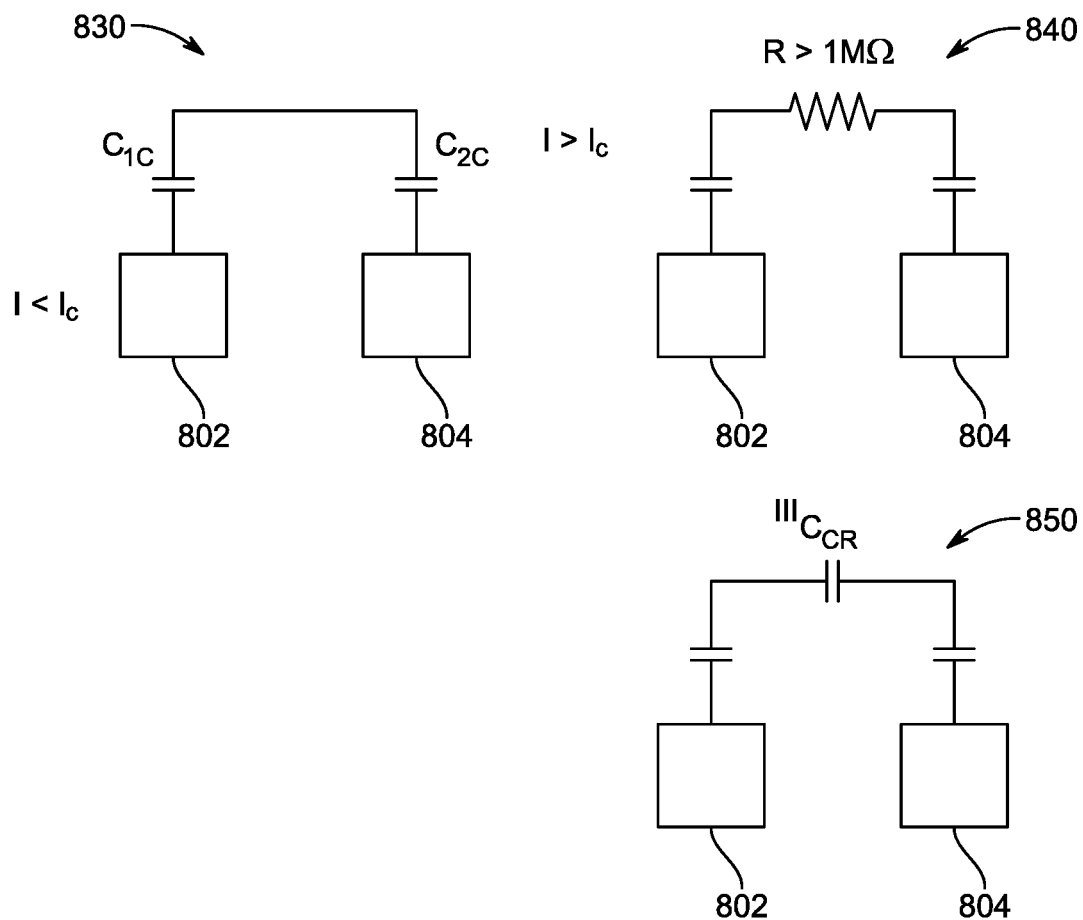
FIG. 8B illustrates various exemplary operative diagrams of the superconducting device, according to certain embodiments.

FIG. 8B illustrates various exemplary operative diagrams of the superconducting device 800, according to certain embodiments. In an aspect, the superconducting lead 808 is configured to operate at one of two states of the capacitive coupling: "On" state capacitive coupling 830 or "Off" state capacitive coupling 840.

During the "On" state capacitive coupling 830, the applied bias current is set below a critical value $I_c$ and the superconducting qubits 802, 804 are entangled. The hotspot nanowire 810 remains in the superconducting state under an electrical current excitation with a value not exceeding the critical current value $I_c$.

During the "Off" state capacitive coupling 840, when the applied bias current is larger than the critical value $I_c$ (cooper pair breaking current), the superconductivity of the hotspot nanowire 810 is brought to a non-equilibrium state. The superconductivity is locally destroyed, and a normal hot spot (in a high resistive state) appears. The high resistive state breaks the coupling between the two superconducting qubits 802, 804, and switches off the coupling between the superconducting qubits 802, 804 in a relatively fast time. A resistance of the nanowire 810 can reach a few MΩ such as 10 MΩ. The hotspot nanowire 810 can be considered as an opened circuit, and as a consequence of the opened circuit, the two superconducting qubits 802, 804 are decoupled from each other.

In an aspect, an infinite resistance can be considered as a capacitance $C_{CR}$, which is estimated based on a length of the hotspot nanowire 810 and is considered as an opened circuit due to the infinite resistance, as shown by 850 in the FIG. 8B.

Figure 9A:
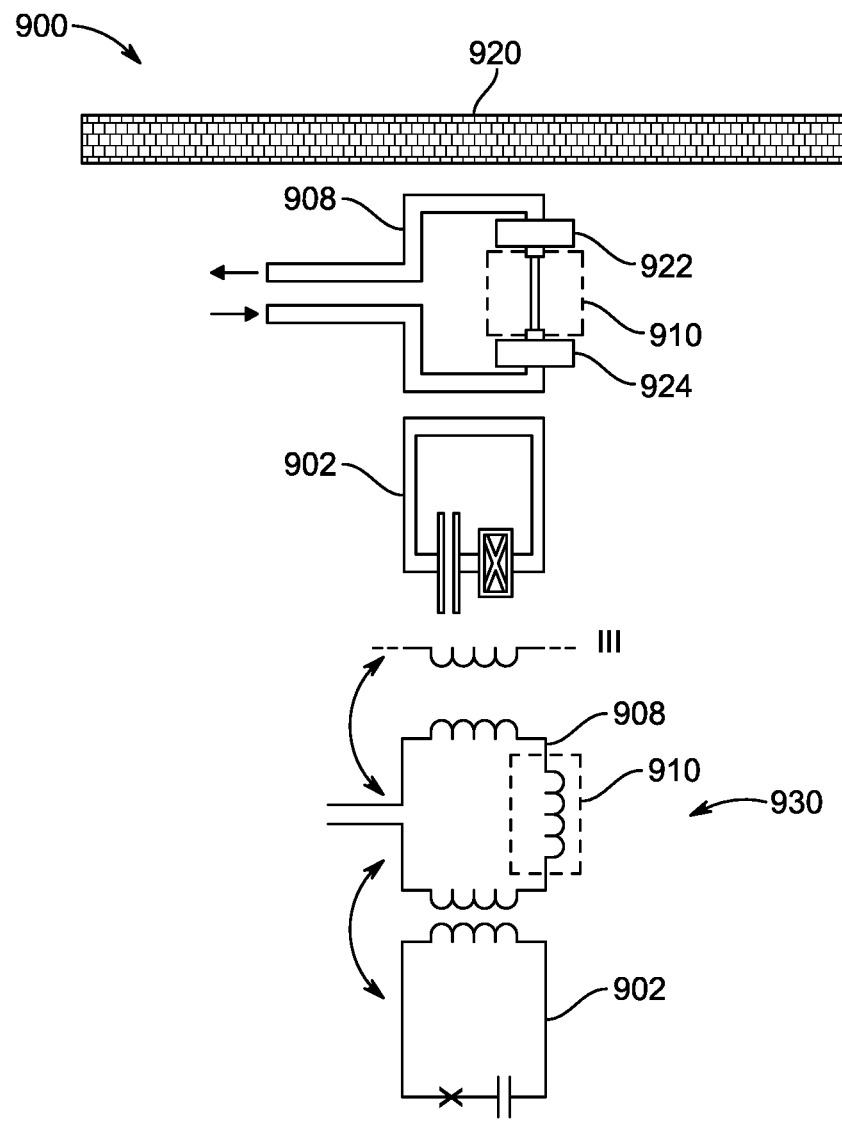
FIG. 9A illustrates an exemplary implementation of using a superconducting loop as an inductive coupler for tuning a coupling between a readout superconducting quantum bus and a superconducting qubit, according to certain embodiments.

FIG. 9A illustrates an exemplary implementation 900 of using a superconducting loop as an inductive coupler 908 for tuning a coupling between a readout superconducting quantum bus 920 and a superconducting qubit 902, according to certain embodiments. In an aspect, the inductive coupler 908 is configured to tune the coupling between the readout superconducting quantum bus 920 and the superconducting qubit 902. Also, FIG. 9A illustrates an equivalent electrical circuit 930 corresponding to the coupling configuration 900.

The superconducting qubit 902 is inductively coupled to the readout superconducting quantum bus 920 through the inductive coupler 908. The inductive coupler 908 is disposed between the superconducting qubit 902 and the readout superconducting quantum bus 920. The inductive coupler 908 has a hotspot nanowire 910. The hotspot nanowire 910 is configured to be biased by a bias current. In an aspect, the hotspot nanowire 910 includes gold layers 922, 924 on both sides. In an example, the hotspot nanowire 910 is made out of a superconducting material having a high resistivity when the hotspot nanowire 910 is switched into a normal state. The hotspot nanowire 910 is configured to be in a superconducting state when the bias current is less than a critical current. When the bias current is not less than the critical current, then the hotspot nanowire 910 is configured to be in a high resistive state.

In an aspect, the inductive coupler 908 is configured to operate at one of two states of the inductive coupling: "On" state inductive coupling or "Off" state inductive coupling. During the "On" state inductive coupling, the applied bias current is set below a critical value $I_c$ and the superconducting qubit 902 and the readout superconducting quantum bus 920 are entangled.

During the "Off" state inductive coupling, when the applied bias current is larger than the critical value $I_c$ (cooper pair breaking current), the superconductivity of the hotspot nanowire 910 is brought to a non-equilibrium state. The superconductivity is locally destroyed, and a normal hot spot (in a high resistive state) appears. The high resistive state breaks the coupling between the superconducting qubit 902 and the readout superconducting quantum bus 920, and switches off the coupling between the superconducting qubit 902 and the readout superconducting quantum bus 920 in a relatively fast time. A resistance of the hotspot nanowire 910 can reach a few MΩ such as 10 MΩ. The hotspot nanowire 910 can be considered as an opened circuit, and as consequence of that, the superconducting qubit 902 and the readout superconducting quantum bus 920 are decoupled from each other.

The coupling between the superconducting qubit 902 and the readout superconducting quantum bus 920 is considered always ON when the bias current of the hotspot nanowire 910 is smaller than the critical current. If the single qubit operation is not required of the superconducting qubit 902 in a given algorithm, then the coupling between the superconducting qubit 902 and the readout superconducting quantum bus 920 can be switched to the OFF state.

Figure 9B:
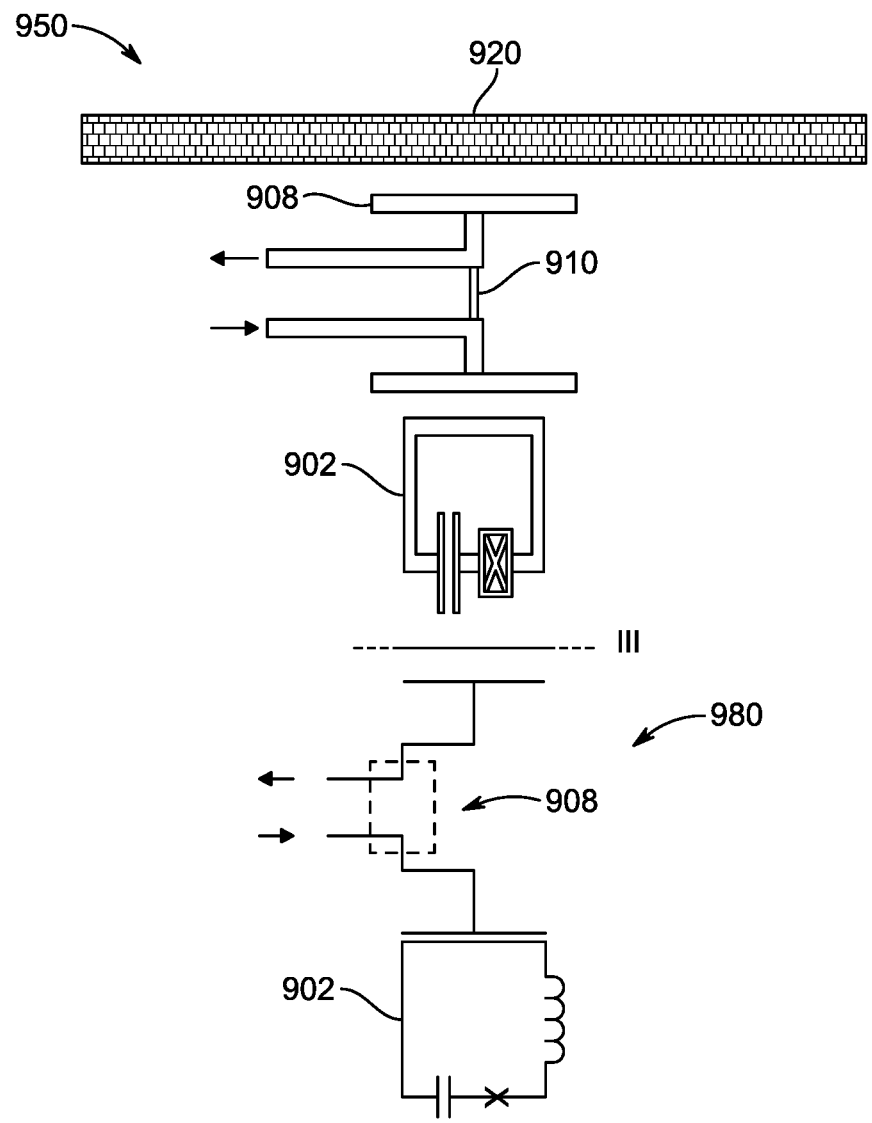
FIG. 9B illustrates an exemplary implementation of using the superconducting loop as a capacitive coupler for tuning the coupling between the readout superconducting quantum bus and the superconducting qubit, according to certain embodiments.

FIG. 9B illustrates an exemplary implementation 950 of using the superconducting loop as a capacitive coupler 908 for tuning the coupling between the readout superconducting quantum bus 920 and the superconducting qubit 902, according to certain embodiments. Also, FIG. 9B illustrates an equivalent electrical circuit 980 corresponding to the coupling configuration 900. In an aspect, the same principle of the inductive coupling and decoupling of the qubit 902 by monitoring the current in the hotspot nanowire 910 above or below the critical current value can be adopted for the capacitive coupling. The capacitive coupling can be used as a switchable and controllable coupler between the superconducting qubit 902 and the readout superconducting quantum bus 920.

In an aspect, the capacitive coupler 908 is configured to operate at one of two states of the capacitive coupling: "On" state capacitive coupling or "Off" state capacitive coupling.

During the "On" state capacitive coupling, the applied bias current is set below a critical value $I_c$ and thus the superconducting qubit 902 and the readout superconducting quantum bus 920 are entangled.

During the "Off" state capacitive coupling, when the applied bias current is larger than the critical value $I_c$ (cooper pair breaking current), a resistance of the hotspot nanowire 910 can reach a few MΩ such as 10 MΩ. The hotspot nanowire 910 can be considered as an opened circuit, and as a consequence of the opened circuit, the superconducting qubit 902 and the readout superconducting quantum bus 920 are decoupled from each other.

In an aspect, both the qubit bias line and the DC bias superconducting line can be filtered to reduce any coherence source of the noise.

In an aspect, dimensions of superconducting qubits (e.g., 102, 104) can be similar to the conventional ones or these having the longest coherence time. In an example, a hotspot nanowire (e.g., 110) can have a length in a range of 1 to 50 μm, a width in a range of 20 nm to 2500 μm, and a thickness in a range of 10 nm to 50 nm.

In an aspect, a superconducting device (e.g., 100) can be employed for coupling any types of qubits that include, but are not limited to: flux qubits, transmon qubits, and phase qubits.

In an aspect, a superconducting qubit can be either capacitively or inductively coupled to a quantum bus through a superconducting loop nanowire, which is easy to process and fabricate.

In an aspect, an active part of a hotspot nanowire (e.g., 110) is deposited in an etched area of a substrate, and therefore the heat generated from the hotspot nanowire cannot affect superconducting qubits near to the hotspot nanowire. Alternatively, the hotspot nanowire can be fabricated on a different chip from the superconducting qubits.

In an aspect, a superconducting device (e.g., 100) is immune to flux noise or to any flux jumps which occur frequently in superconducting leads. On comparison with the conventional devices using a single Josephson junction or RF-SQUID, the superconducting device shows a very good stability, as the conventional devices are affected easily by any type of fluctuation in the surrounding environment.

In an aspect, the quasi particles generated by the hotspot nanowire can be trapped by a gold trap near the active area of the nanowire.

In an aspect, the hotspot nanowire can be turned off very fast, such that the dissipated energy is not harmful at all for qubit coherence time.

In an aspect, during the coupling and decoupling process, the superconducting qubits in the superconducting device can operate at their optimal points where the coherence properties are greatest.

In an aspect, the superconducting device can be employed as an electronic switch between different components in quantum circuits.

In an overall aspect, the present disclosure illustrates the necessity of controlling the entanglement between superconducting qubits (e.g., 102, 104) in the quantum information processing. In an aspect, the two superconducting qubits (any type) and a superconducting loop (e.g., 108) are deposited on a surface of a substrate (e.g., 106). The superconducting loop includes a coupling loop between the two superconducting qubits. The superconducting loop also includes a hotspot nanowire (e.g., 110) which is an active layer and can dissipate heat during operation. To avoid any harmful effect, which may be introduced during the heat dissipation of the hotspot nanowire, on the two superconducting qubits, the hotspot nanowire can be fabricated inside an etched hole of the substrate. In an aspect, to suppress a quasi-particle diffusion into the superconducting loop, gold layers (e.g., 122, 124) can be incorporated on both sides of the hotspot nanowire. In an example, the hotspot nanowire and the coupling loop of the superconducting loop can be fabricated on different chips and be connected to each other using bonding wires between the two chips. Moreover, the superconducting loop can be integrated between a reading resonator and the superconducting qubit. Two superconducting qubits are entangled when a bias current of the superconducting quits is smaller than a critical current $I_c$ and are decoupled when the bias current exceeds $I_c$.

Aspects of the disclosure provide a first superconducting device. The first superconducting device includes two adjacent superconducting qubits disposed on a surface of a first substrate, and a superconducting loop disposed between the two adjacent superconducting qubits. The superconducting loop is inductively coupled to the two adjacent superconducting qubits. The superconducting loop includes a hotspot nanowire that is biased by a bias current. The hotspot nanowire is in a superconducting state when the bias current is less than a critical current and in a high resistive state when the bias current is not less than the critical current.

In an aspect, each superconducting qubit is associated with a respective resonator to couple a readout superconducting quantum bus.

In an aspect, each resonator includes a hotspot nanowire.

In an aspect, the hotspot nanowire is embedded in an etched hole of the first substrate.

In an aspect, both sides of the hotspot nanowire include gold layers.

In an aspect, the first superconducting device includes a superconducting current line underneath the hotspot nanowire with an isolating layer. The superconducting current line is biased by a direct current to generate a magnetic field.

In an aspect, the isolating layer includes silicon oxide.

In an aspect, the direct current is less than the critical current.

In an aspect, the hotspot nanowire is disposed on a second substrate.

In an aspect, the first substrate and the second substrate are bonded through bonding wires.

Aspects of the disclosure provide a second superconducting device. The second superconducting device includes two adjacent superconducting qubits and a superconducting lead. The two adjacent superconducting qubits are disposed on a surface of a first substrate. The superconducting lead extends from one superconducting qubit to the other superconducting qubit and is capacitively coupled to the two adjacent superconducting qubits. The superconducting lead includes a hotspot nanowire that is biased by a bias current. The hotspot nanowire is configured to be in a superconducting state when the bias current is less than a critical current and in a high resistive state when the bias current is not less than the critical current.

In an aspect, each superconducting qubit is associated with a respective resonator to couple a readout superconducting quantum bus.

In an aspect, each resonator includes a hotspot nanowire.

In an aspect, the hotspot nanowire is embedded in an etched hole of the first substrate.

In an aspect, both sides of the hotspot nanowire include gold layers.

In an aspect, the second superconducting device includes a superconducting current line underneath the hotspot nanowire with an isolating layer, the superconducting current line being biased by a direct current to generate a magnetic field.

In an aspect, the isolating layer includes silicon oxide.

In an aspect, the direct current is less than the critical current.

In an aspect, the hotspot nanowire is disposed on a second substrate.

In an aspect, the first substrate and the second substrate are bonded through bonding wires.

The above-described hardware description is a non-limiting example of a corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A superconducting device, comprising:
   two adjacent superconducting qubits disposed on a surface of a first substrate; and
   a superconducting loop disposed between the two adjacent superconducting qubits and being inductively coupled to the two adjacent superconducting qubits, the superconducting loop including a hotspot nanowire that is biased by a bias current, the hotspot nanowire being in a superconducting state when the bias current is less than a critical current and in a high resistive state when the bias current is not less than the critical current.

2. The superconducting device of claim 1, wherein each superconducting qubit is associated with a respective resonator to couple a readout superconducting quantum bus.

3. The superconducting device of claim 2, wherein each resonator includes a hotspot nanowire.

4. The superconducting device of claim 1, wherein the hotspot nanowire is embedded in an etched hole of the first substrate.

5. The superconducting device of claim 1, wherein both sides of the hotspot nanowire include gold layers.

6. The superconducting device of claim 1, further comprising:
   a superconducting current line underneath the hotspot nanowire with an isolating layer, the superconducting current line being biased by a direct current to generate a magnetic field.

7. The superconducting device of claim 6, wherein the isolating layer includes silicon oxide.

8. The superconducting device of claim 6, wherein the direct current is less than the critical current.

9. The superconducting device of claim 1, wherein the hotspot nanowire is disposed on a second substrate.

10. The superconducting device of claim 9, wherein the first substrate and the second substrate are bonded through bonding wires.

11. A superconducting device, comprising:
    two adjacent superconducting qubits disposed on a surface of a first substrate; and
    a superconducting lead extending from one superconducting qubit to the other and being capacitively coupled to the two adjacent superconducting qubits, the superconducting lead including a hotspot nanowire that is biased by a bias current, the hotspot nanowire being in a superconducting state when the bias current is less than a critical current and in a high resistive state when the bias current is not less than the critical current.

12. The superconducting device of claim 11, wherein each superconducting qubit is associated with a respective resonator to couple a readout superconducting quantum bus.

13. The superconducting device of claim 12, wherein each resonator includes a hotspot nanowire.

14. The superconducting device of claim 11, wherein the hotspot nanowire is embedded in an etched hole of the first substrate.

15. The superconducting device of claim 11, wherein both sides of the hotspot nanowire include gold layers.

16. The superconducting device of claim 11, further comprising:
    a superconducting current line underneath the hotspot nanowire with an isolating layer, the superconducting current line being biased by a direct current to generate a magnetic field.

17. The superconducting device of claim 16, wherein the isolating layer includes silicon oxide.

18. The superconducting device of claim 16, wherein the direct current is less than the critical current.

19. The superconducting device of claim 11, wherein the hotspot nanowire is disposed on a second substrate.

20. The superconducting device of claim 19, wherein the first substrate and the second substrate are bonded through bonding wires.

* * * * *